United States Patent
Cho et al.

(10) Patent No.: US 12,027,467 B2
(45) Date of Patent: Jul. 2, 2024

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Wei-Chih Cho, Kaohsiung (TW); Shao-Lun Yang, Kaohsiung (TW); Chun-Hung Yeh, Kaohsiung (TW); Tsung-Wei Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/163,213

(22) Filed: Jan. 29, 2021

(65) Prior Publication Data

US 2022/0246533 A1     Aug. 4, 2022

(51) Int. Cl.
*H01L 23/538*     (2006.01)
*H01L 21/48*      (2006.01)
*H01L 21/56*      (2006.01)
*H01L 23/31*      (2006.01)

(52) U.S. Cl.
CPC ...... *H01L 23/5389* (2013.01); *H01L 21/4853* (2013.01); *H01L 21/4857* (2013.01); *H01L 21/565* (2013.01); *H01L 23/3121* (2013.01); *H01L 23/5383* (2013.01); *H01L 23/5386* (2013.01)

(58) Field of Classification Search
CPC ............. H01L 23/5389; H01L 21/4853; H01L 21/4857; H01L 21/565; H01L 23/3121; H01L 23/5383; H01L 23/5386
See application file for complete search history.

(56) References Cited

U.S. PATENT DOCUMENTS

| | | | |
|---|---|---|---|
| 10,206,285 B1* | 2/2019 | Yoshida | H05K 1/185 |
| 10,257,942 B1* | 4/2019 | Yoshida | H05K 3/42 |
| 2004/0101993 A1* | 5/2004 | Salmon | H01L 24/98 |
| | | | 257/E23.068 |
| 2011/0062574 A1* | 3/2011 | Jang | H01L 23/3128 |
| | | | 257/E23.116 |
| 2012/0103667 A1* | 5/2012 | Ito | H05K 3/108 |
| | | | 174/257 |
| 2017/0053898 A1* | 2/2017 | Yeh | H01L 25/50 |
| 2020/0006274 A1* | 1/2020 | Chiang | H01L 24/20 |

(Continued)

FOREIGN PATENT DOCUMENTS

WO     WO-2014110482 A1 *  7/2014  ......... H01L 23/3157

*Primary Examiner* — Fernando L Toledo
*Assistant Examiner* — Neil R Prasad
(74) *Attorney, Agent, or Firm* — FOLEY & LARDNER LLP

(57) ABSTRACT

The present disclosure provides a semiconductor device package and a method of manufacturing the same. The semiconductor device package includes a substrate, an interconnection structure, a package body, and a first electronic component. The interconnection structure is disposed on the substrate. The package body is disposed on the substrate and partially covers the interconnection structure. The package body has a position limiting structure around the interconnection structure. The first electronic component is disposed on the interconnection structure and electrically connected to the interconnection structure.

20 Claims, 13 Drawing Sheets

(56) References Cited

U.S. PATENT DOCUMENTS

| | | | |
|---|---|---|---|
| 2021/0202413 A1* | 7/2021 | Lee | H01L 24/03 |
| 2022/0037295 A1* | 2/2022 | Chung | H01L 23/544 |
| 2022/0208655 A1* | 6/2022 | Manack | H01L 23/3107 |

* cited by examiner

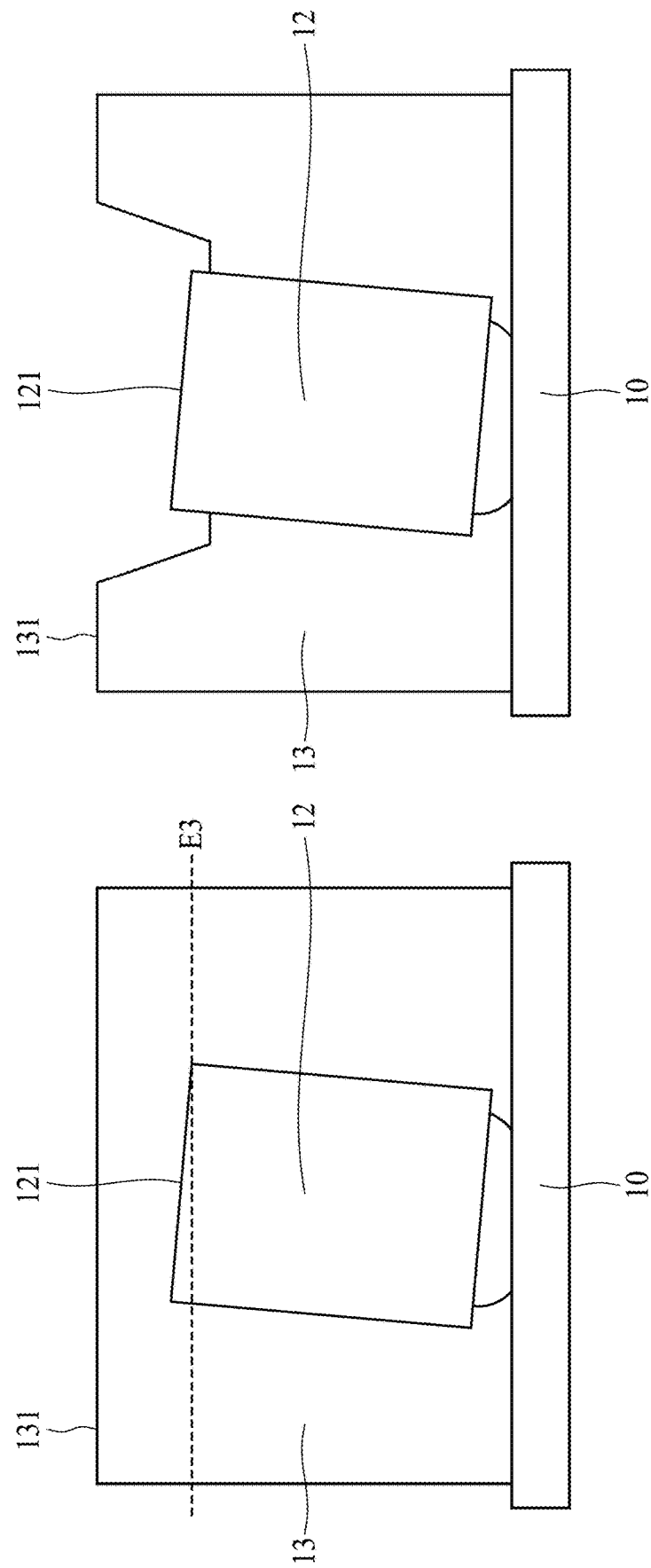

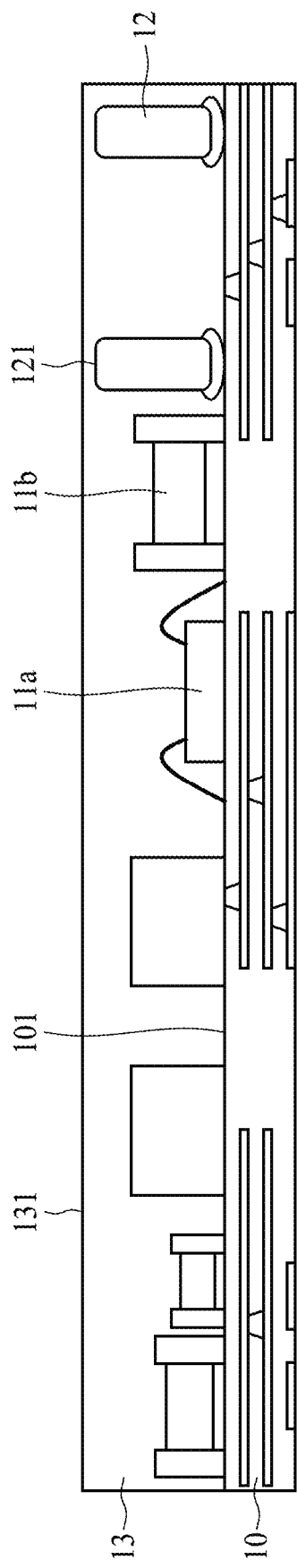
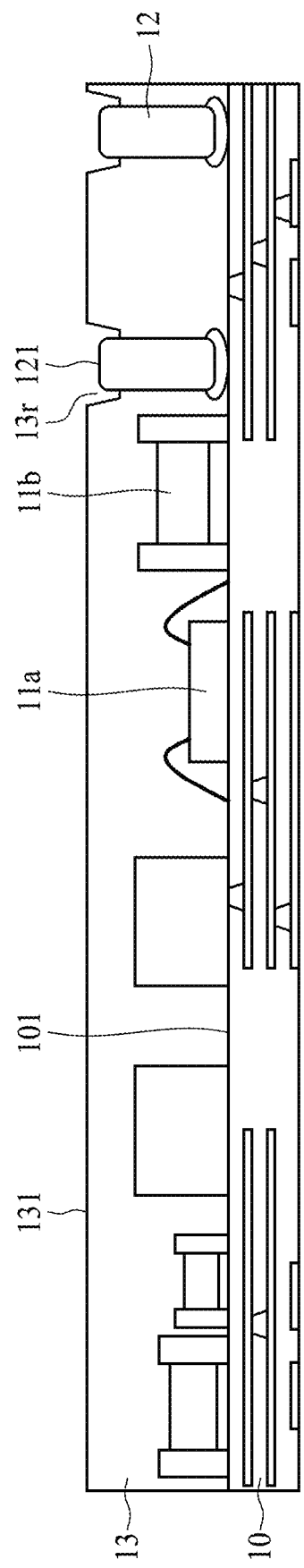
FIG. 4C
FIG. 4D

SEMICONDUCTOR DEVICE PACKAGE AND METHOD OF MANUFACTURING THE SAME

BACKGROUND

1. Field of the Disclosure

The present disclosure relates to a semiconductor device package having an interconnection structure and a method of manufacturing the same.

2. Description of Related Art

As the requirement of the performance and the functionality of a semiconductor device package increases, more electronic components are integrated within a single semiconductor device package. A semiconductor device package may include an electronic component having an area and thickness much larger than other electronic components. If said electronic component is integrated with other electronic components into the semiconductor device package, the area and thickness of the semiconductor device package would be unduly increased, which would hinder miniaturization of the semiconductor device package.

SUMMARY

According to some embodiments of the present disclosure, a semiconductor device package includes a substrate, an interconnection structure, a package body, and a first electronic component. The interconnection structure is disposed on the substrate. The package body is disposed on the substrate and partially covers the interconnection structure. The package body has a position limiting structure around the interconnection structure. The first electronic component is disposed on the interconnection structure and electrically connected to the interconnection structure.

According to some embodiments of the present disclosure, a semiconductor device package includes a substrate, an interconnection structure, and a package body. The interconnection structure is disposed on the substrate. The package body is disposed on the substrate. The package body has a recess exposing a portion of the lateral surface of the interconnection structure. The exposed portion of the lateral surface of the interconnection structure has various lengths. A height of the interconnection structure is less than a thickness of the package body.

According to some embodiments of the present disclosure, a method of manufacturing a semiconductor device package includes (a) providing a substrate having an interconnection structure and a package body thereon, the package body fully covering the interconnection structure; and (b) forming a recess on the package body to expose a top surface and a portion of a lateral surface of the interconnection structure.

In order to further understanding of the present disclosure, the following embodiments are provided along with illustrations to facilitate appreciation of the present disclosure; however, the appended drawings are merely provided for reference and illustration, and do not limit the scope of the present disclosure.

BRIEF DESCRIPTION OF THE DRAWINGS

FIG. 3E illustrates a tilted interconnection structure, in accordance with some embodiments of the present disclosure.

FIG. 3F illustrates a tilted interconnection structure, in accordance with some embodiments of the present disclosure.

DETAILED DESCRIPTION

The aforementioned illustrations and following detailed descriptions are examples for the purpose of explaining the present disclosure.

Figure 1:
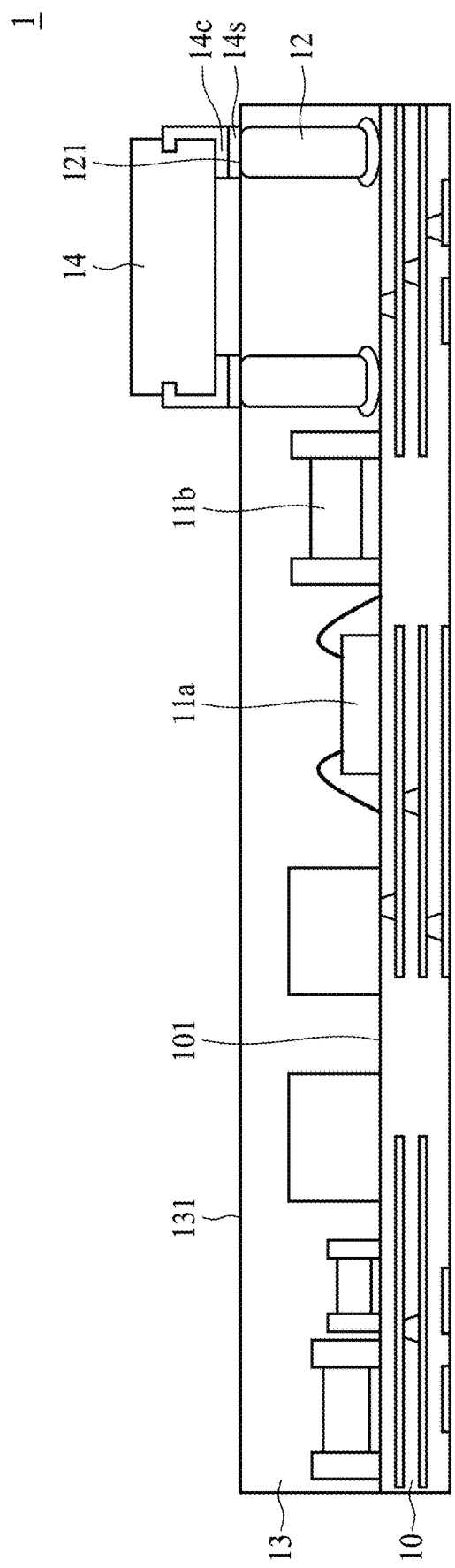
FIG. 1 is a cross-sectional view of a semiconductor device package, in accordance with an embodiment of the present disclosure.

FIG. 1 illustrates a cross-sectional view of a semiconductor device package 1 in accordance with some embodiments of the present disclosure. The semiconductor device package 1 includes a substrate 10, electronic components 11a, 11b, 14, an interconnection structure 12, and a package body 13.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. In some embodiments, the substrate 10 may be a single-layer substrate or multi-layer substrate which includes a core layer and a conductive material and/or structure disposed on or adjacent to both surfaces of the substrate 10. The conductive material and/or structure may include a plurality of traces. The substrate 10 may include one or more conductive pads in proximity to, adjacent to, or embedded in and exposed at a surface 101 of the substrate 10.

The electronic components 11a, 11b are disposed on the surface 101 of the substrate 10 and electrically connected to the substrate 10 (e.g., to the conductive pads). The electronic components 11a, 11b may include active electrical components and/or passive electrical components. For example, the electronic component 11a may be a chip or a die including a semiconductor substrate, one or more integrated circuit devices and one or more overlying interconnection structures therein. For example, the electronic component 11b may be a passive electrical component, such as a capacitor, a resistor or an inductor. Each electronic components 11a, 11b may be electrically connected to one or more of another electronic components 11a, 11b and to the substrate 10 (e.g., to the RDL), and electrical connection may be attained by way of flip-chip or wire-bond techniques.

The interconnection structure 12 is disposed on the surface 101 of the substrate 10 and electrically connected to the substrate 10 (e.g., to the conductive pads). In some embodiments, the interconnection structure 12 is electrically connected to the substrate 10 through, for example, soldering materials (e.g., solder balls, solder pastes, or the like). The interconnection structure 12 may provide an electrical connection between the electronic component 14 and the substrate 10. In some embodiments, the interconnection structure 12 may include a conductive pillar, a solder ball, or any other suitable conductive structures. In some embodiments, the interconnection structure 12 may include, for example, aluminum (Al), copper (Cu), chromium (Cr), tin (Sn), gold (Au), silver (Ag), nickel (Ni) or stainless steel, or a mixture, an alloy, or other combination thereof. In some embodiments, a height of the interconnection structure 12 is larger than a thickness or a height of any other electronic components disposed on the surface 101 of the substrate 10.

The package body 13 is disposed on the surface 101 of the substrate 10. The package body 13 covers (or encapsulates) the electronic components 11a and 11b. The package body 13 covers a portion of the interconnection structure 12. For example, the package body 13 fully covers a lateral surface of the interconnection structure 12. The package body 13 exposes a surface 121 of the interconnection structure 12. The surface 121 of the interconnection structure 12 is substantially coplanar with a surface 131 of the package body 13. In some embodiments, a roughness of the surface 121 of the interconnection structure 12 is substantially the same as a roughness of the surface 131 of the package body 13. In some embodiments, the package body 13 includes an epoxy resin having fillers, a molding compound (e.g., an epoxy molding compound or other molding compound), a polyimide, a phenolic compound or material, a material with a silicone dispersed therein, or a combination thereof.

The electronic component 14 is disposed on the interconnection structure 12 and electrically connected to the interconnection structure 12. The electronic component 14 may be electrically connected to the substrate 10 through the interconnection structure 12. The electronic component 14 may be electrically connected to the electronic components 11a, 11b through the interconnection structure 12 and the substrate 10. The electronic component 14 has electrical contacts 14c electrically connected to the surface 121 of the interconnection structure 12 through, for example, a conductive element 14s (e.g., soldering material). In some embodiments, the electronic component 14 may have a thickness greater than the thickness of any of the electronic components covered by the package body 13. In some embodiments, the thickness of the electronic component 14 is equal to or greater than the thickness of the package body 13 (or the height of the interconnection structure 12). In some embodiments, the electronic component may include an active component (e.g., a die or a chip) or a passive component (e.g., a resistor, a capacitor, or an inductor). In some embodiments, a number of the interconnection structures 12 can be determined based on the number of the electrical contacts 14c of the electronic component 14.

In some comparative embodiments, the electronic component 14 can be disposed on the surface 101 of the substrate 10 and covered by the package body 13, and the interconnection structure 12 can be omitted. However, since the thickness of the electronic component 14 may be much higher than other electronic components (e.g., the electronic components 11a, 11b), disposing the electronic component 14 into the package body 13 will increase the thickness of the package body 13. In addition, the spaces over the electronic components 11a, 11b are wasted. In accordance with the embodiments as shown in FIG. 1, by placing the electronic component 14 outside the package body 13 and connecting the electronic component 14 to the subject 10 through the interconnection structure 12, the thickness of the package body 13 can be reduced.

Figure 2A:
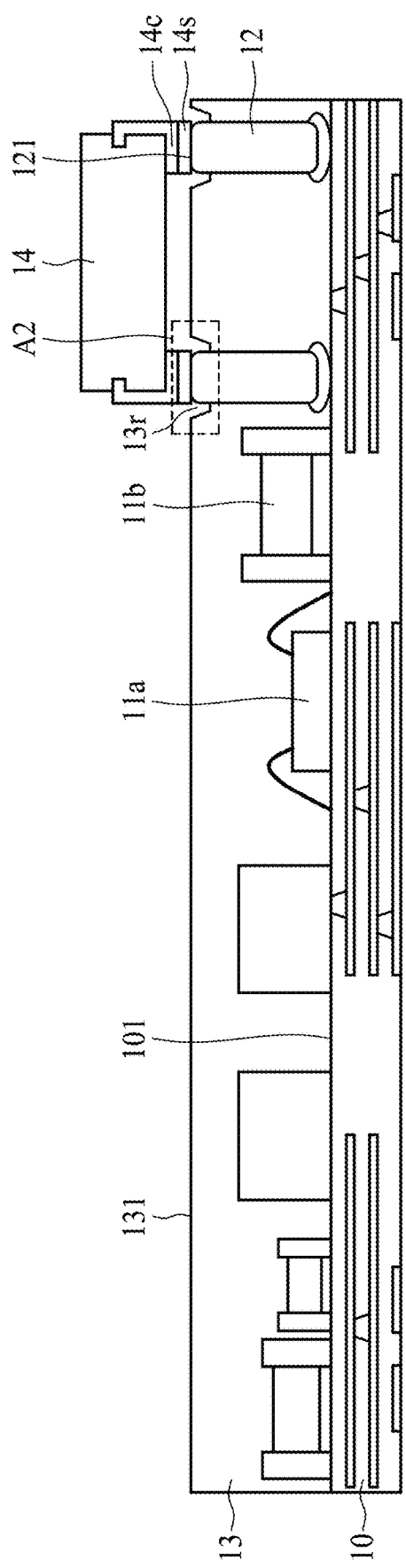
FIG. 2A is a cross-sectional view of a semiconductor device package, in accordance with an embodiment of the present disclosure.
Figure 2B:
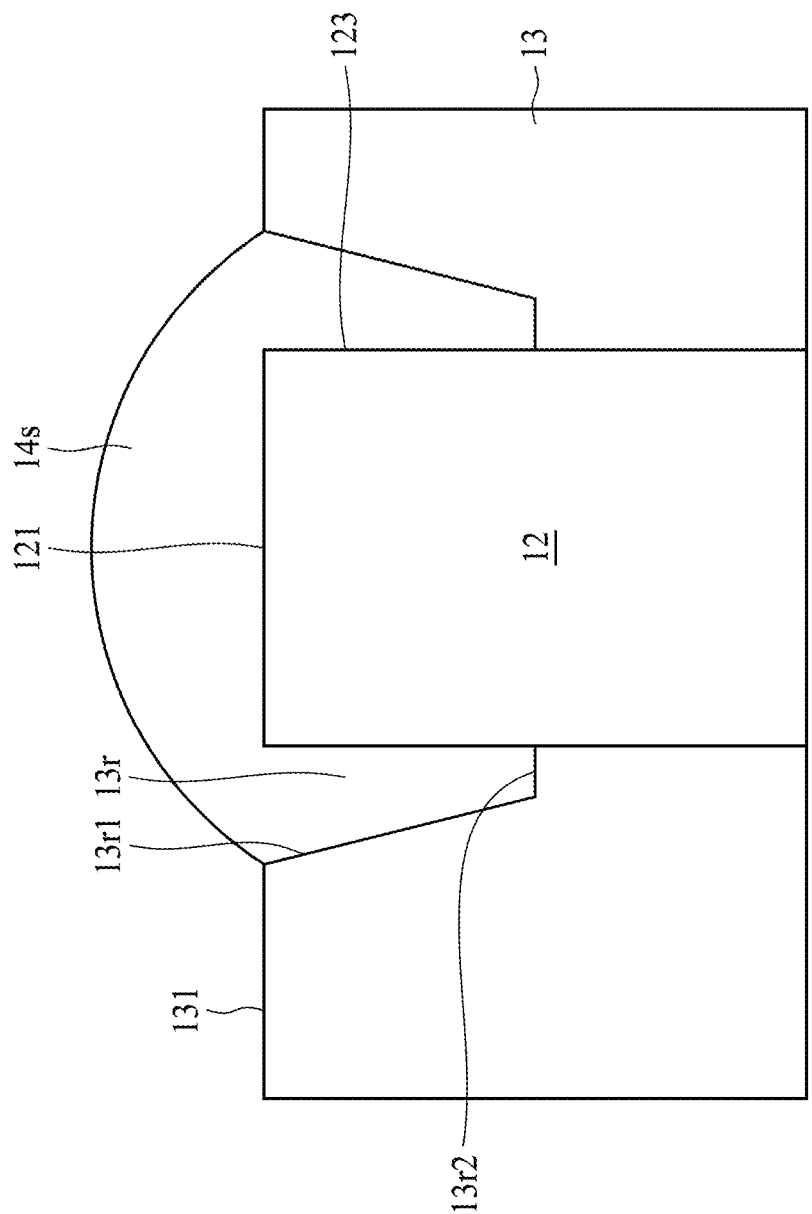
FIG. 2B illustrates an enlarged view of a portion of the semiconductor device package as shown in FIG. 2A, in accordance with some embodiments of the present disclosure.

FIG. 2A illustrates a cross-sectional view of a semiconductor device package 2, in accordance with some embodiments of the present disclosure. FIG. 2B illustrates an enlarged view of a portion of the semiconductor device package 2 encircled by a dotted-line box A2, in accordance with some embodiments of the present disclosure. The semiconductor device package 2 is similar to the semiconductor device package 1 as shown in FIG. 1, and some of the differences therebetween are described below.

The package body 13 is a recess 13r. As shown in FIG. 2B, the recess 13r is recessed from the surface 131 of the package body 13 into the package body 13. The recess 13r exposes a portion of the lateral surface 123 of the interconnection structure 12. The exposed portion of the lateral surface 123 of the interconnection structure 12 is spaced apart from the package body 13. There is a gap between the exposed portion of the lateral surface 123 of the interconnection structure 12 and the sidewall 13r1 of the recess 13r. In some embodiments, the sidewall 13r1 has an inclined surface. For example, the sidewall 13r1 and the surface 131 define an angle larger than 90 degrees. In some embodiments, a topmost surface of the electronic components 11a, 11b is lower than a bottom surface of the recess 13r with respect to the substrate 10.

The conductive element 14s (e.g., the soldering material) is disposed within the recess 13r. The conductive element 14s surrounds the exposed portion of the lateral surface 123 of the interconnection structure 12. The conductive element 14s is in contact with the lateral surface 123 of the interconnection structure 12. The conductive element 14s is in contact with the sidewall 13r1 of the recess 13r.

In some embodiments, the recess 13r may be formed by etching, laser drilling, mechanical drilling, or any other suitable operations. In particular, the recess 13r may be formed by the following operations: (i) forming the package body 13 to fully cover the interconnection structure 12; (ii) removing a portion of the package body 13 to expose the surface 121 of the interconnection structure 12 by, for example, grinding (a portion of the interconnection structure 12 may be removed as well during the removal operation); and (iii) forming the recess 13r. The roughness of the sidewall 13r1 and the roughness of the bottom surface 13r2 of the recess 13r are greater than the roughness of the surface 131 of the package body 13. The roughness of the sidewall 13r1 may be the same as the roughness of the bottom surface 13r2 of the recess 13r. The roughness of the exposed portion of the lateral surface 123 of the interconnection structure 12 may be greater than the roughness of the surface 121 of the interconnection structure 12. The roughness of the surface 121 of the interconnection structure 12 is substantially the same as the roughness of the surface 131 of the package body 13. In some embodiments, the roughness of the exposed portion of the lateral surface 123 of the interconnection structure 12 is greater than the roughness of the other portion of the lateral surface 123 of the interconnection structure 12 covered by the package body 13.

As shown in FIG. 1, the conductive element 14s merely contacts the surface 121 of the interconnection structure 12. In other words, the contacting area between the conductive element 14s and the interconnection structure 12 merely includes the surface 121. If the surface 121 is too smooth, the conductive element 14s may shift, and the displacement between the conductive element 14s (or the electronic component 14) and the interconnection structure 12 occurs, which may cause disconnection between the conductive element 14s (or the electronic component 14) and the interconnection structure 12. In addition, the conductive element 14s may be detached from the surface 121 of the interconnection structure 12, which would also cause disconnection between the conductive element 14s (or the electronic component 14) and the interconnection structure 12.

In accordance with the embodiments as shown in FIGS. 2A and 2B, the conductive material 14s is disposed on the surface 121 of the interconnection structure 12 and within the recess 13r. Therefore, the contacting areas between the conductive element 14s and the interconnection structure 12 includes the surface 121 and the exposed portion of the lateral surface 123. Increasing the conducting areas can increase the connection strength between the conductive element 14s and the interconnection structure 12, which can prevent the conductive element 14s from being detached from the interconnection structure 12.

In addition, the recess 13r may function as a position limiting structure for the conductive element 14s. For example, the conducive element 14s is disposed within the recess 13r and the movement of the conductive element 14s is limited by the recess 13r (e.g., by the sidewall 13r1), and thus the shifting issue of the conductive element 14s can be mitigated or eliminated.

Figure 3A:
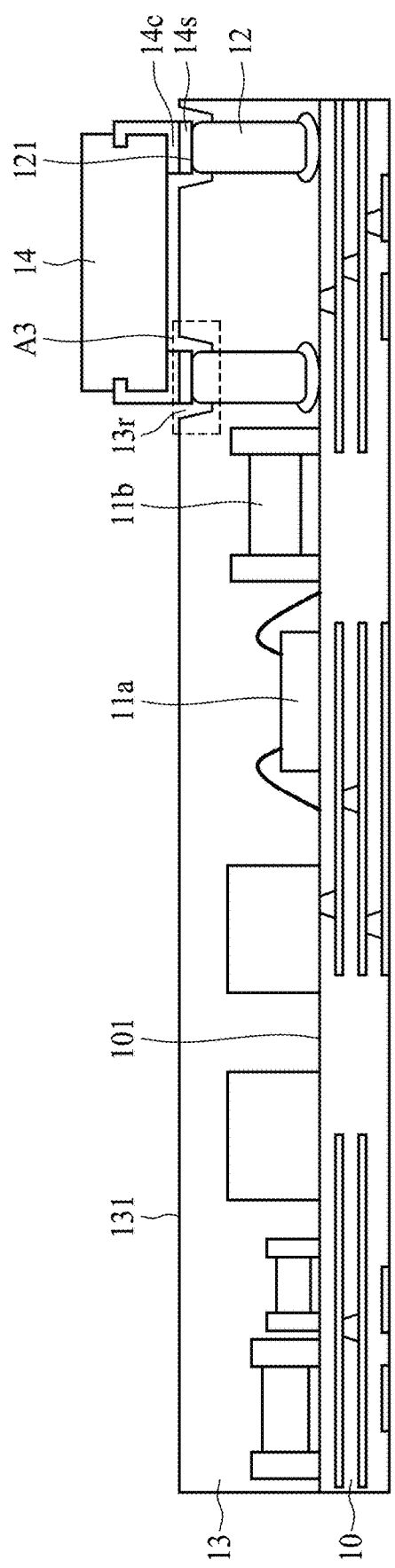
FIG. 3A is a cross-sectional view of a semiconductor device package, in accordance with an embodiment of the present disclosure.
Figure 3B:
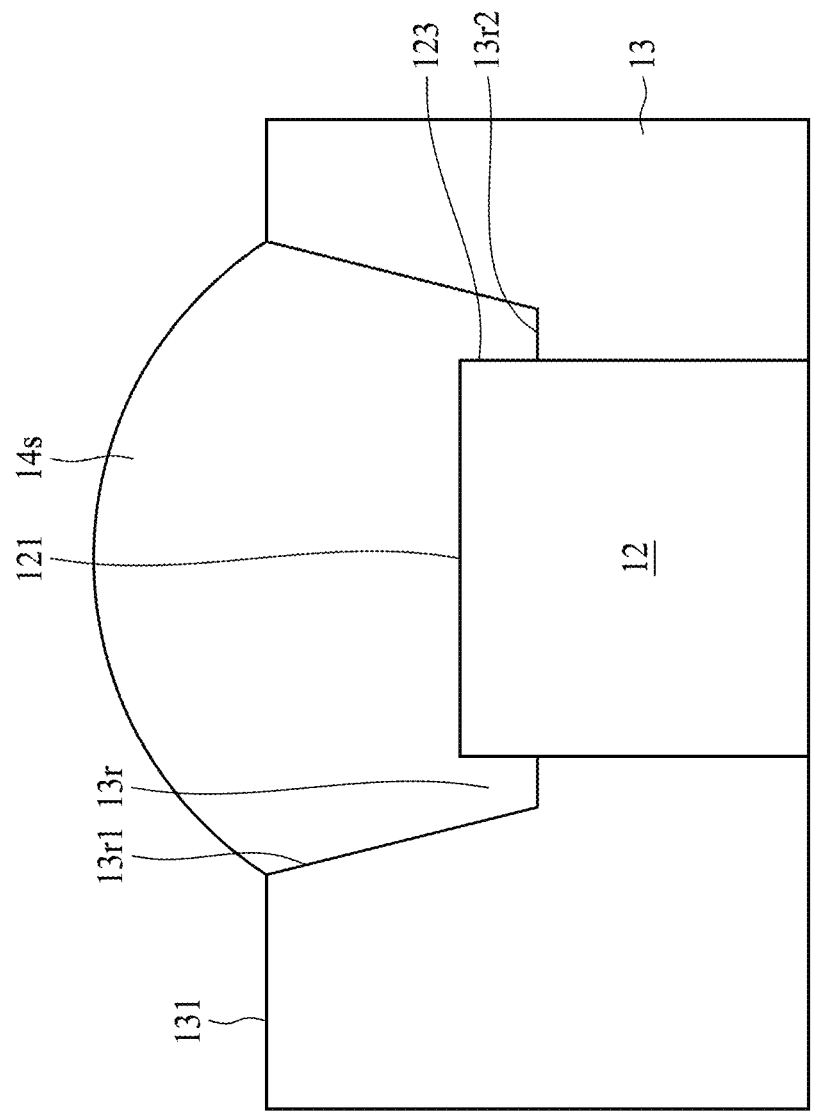
FIG. 3B illustrates an enlarged view of a portion of the semiconductor device package as shown in FIG. 3A, in accordance with some embodiments of the present disclosure.
Figure 3C:
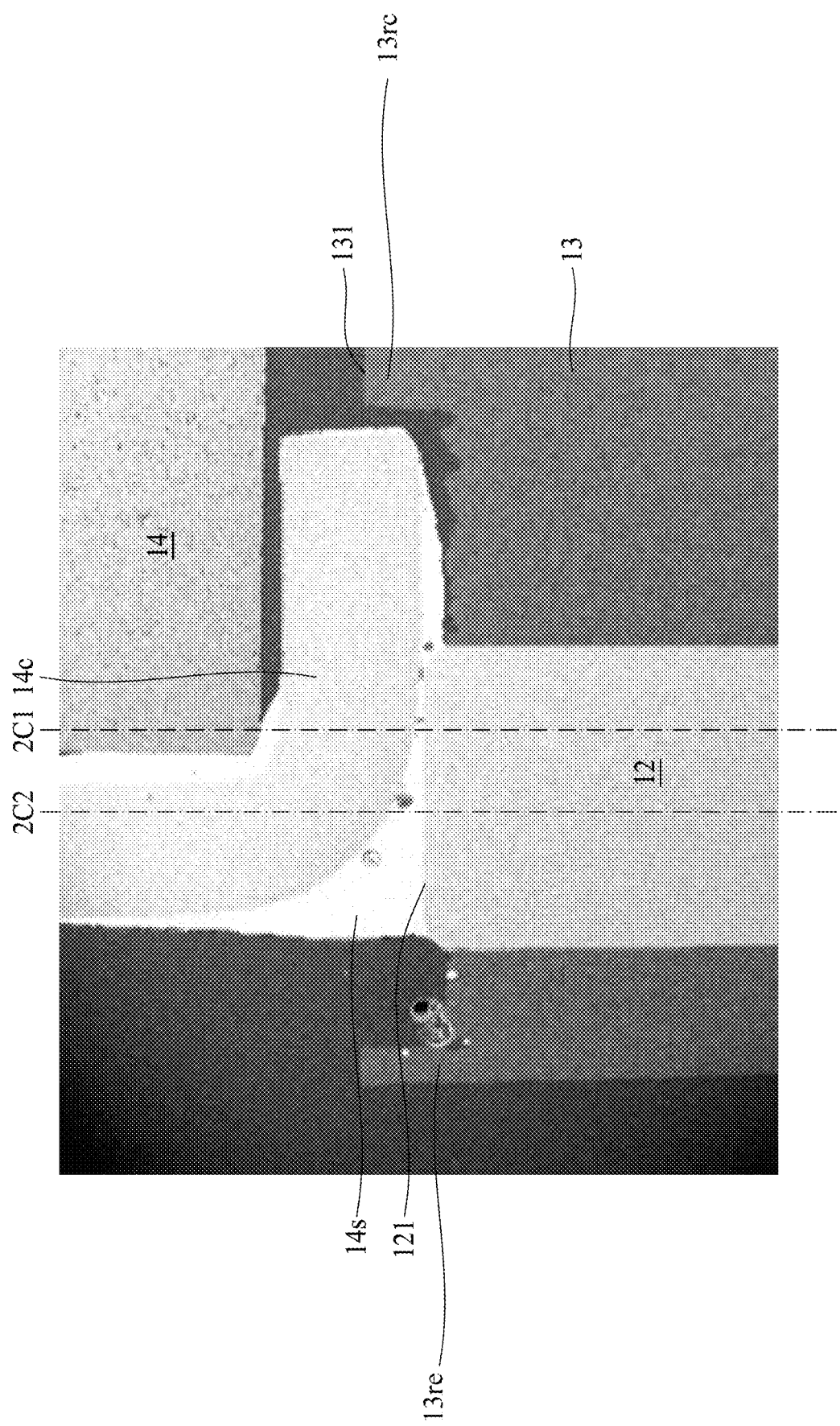
FIG. 3C illustrates an image of a portion of the semiconductor device package as shown in FIG. 3A, in accordance with some embodiments of the present disclosure.
Figure 3D:
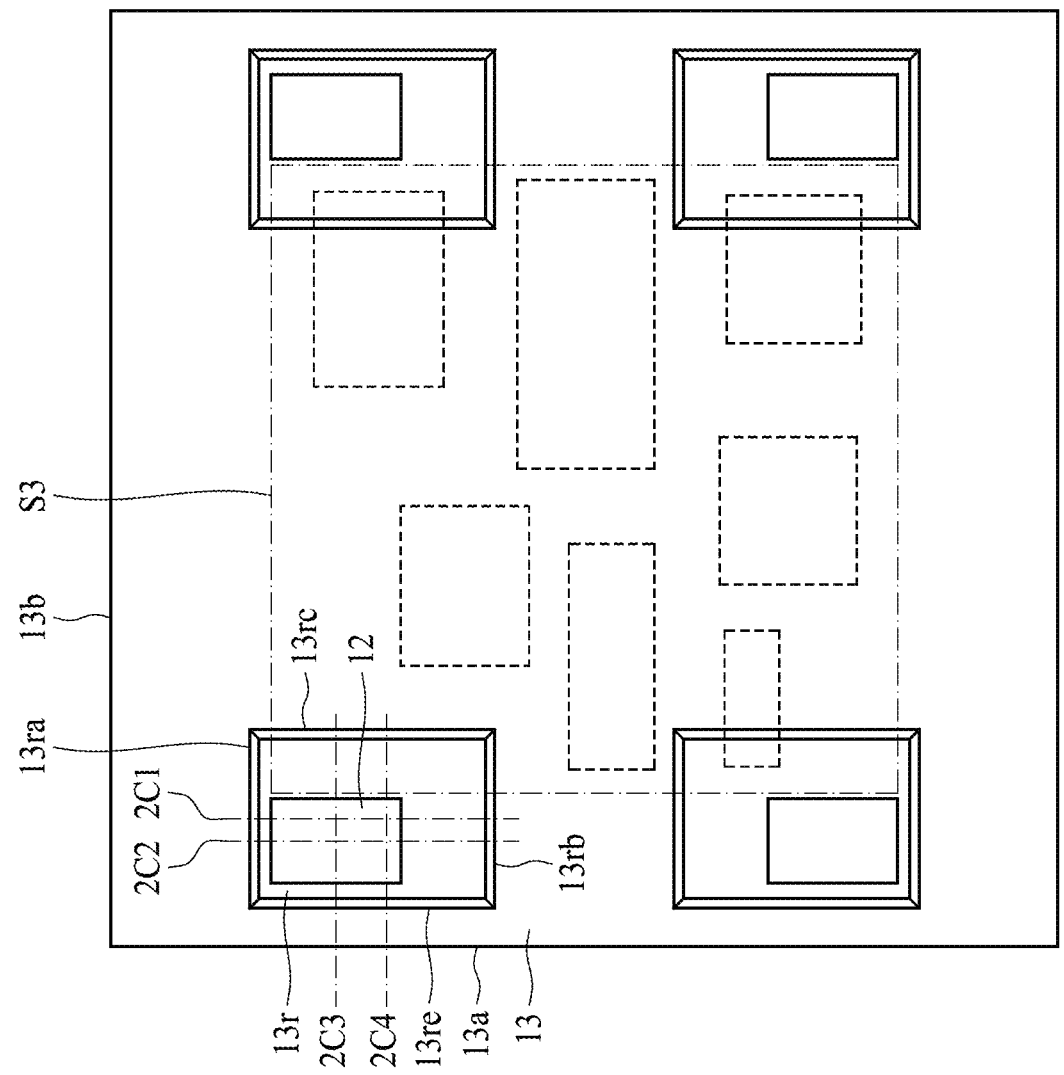
FIG. 3D illustrates a top view of the semiconductor device package as shown in FIG. 3A, in accordance with some embodiments of the present disclosure.

FIG. 3A illustrates a cross-sectional view of a semiconductor device package 3, in accordance with some embodiments of the present disclosure. FIG. 3B illustrates an enlarged view of a portion of the semiconductor device package 3 encircled by a dotted-line box A3, in accordance with some embodiments of the present disclosure. FIG. 3C illustrates an image of a portion of the semiconductor device package 3 captured by, for example, a scanning electron microscope (SEM), in accordance with some embodiments of the present disclosure. FIG. 3D illustrates a top view of the semiconductor device package 3, in accordance with some embodiments of the present disclosure. The semiconductor device package 3 is similar to the semiconductor device package 2 as shown in FIG. 2A, and some of the differences therebetween are described below.

As shown in FIG. 2A and FIG. 2B, the surface 121 of the interconnection structure 12 and the surface 131 of the package body 13 have substantially identical elevation. For example, the height of the interconnection structure 12 is substantially the same as the thickness of the package body 13. As shown in FIG. 3A and FIG. 3B, the surface 121 of the interconnection structure 12 is recessed from the surface 131 of the package body 13. For example, the height of the interconnection structure 12 is less than the thickness of the package body 13. The surface 121 of the interconnection structure 12 has a higher elevation compared with the bottom surface 13r2 of the recess 13r. For example, the surface 121 of the interconnection structure 12 is between the surface 131 of the package body 13 and the bottom surface 13r2 of the recess 13r.

In some embodiments, unlike the structure as shown in FIG. 2B, in FIG. 3B, the recess 13r is formed without thinning the package body 13 (detailed descriptions of the manufacturing processes will be described below). Therefore, compared with the structure as shown in FIG. 2B, the manufacturing time and cost for manufacturing the structure as shown in FIG. 3B can be reduced. In addition, since the surface 121 of the interconnection structure 12 is recessed from the surface 131 of the package body 13, a portion of the electrical contacts 14c of the electronic component 14 may be disposed within the recess 13r. The electrical contacts 14c of the electronic component 14 are further limited by the recess 13r (e.g., by the sidewall 13r1 of the recess 13r). In other words, the recess 13r can function as a position limiting structure for the electronic component 14, which can provide a better position limiting effect for the electronic component 14 compared with the structure as shown in FIG. 2B.

In some embodiments, the roughness of the surface 121 of the interconnection structure 12 is substantially the same as the roughness of the exposed portion of the lateral surface 123 of the interconnection structure 12. In some embodiments, the roughness of the exposed portion of the lateral surface 123 of the interconnection structure 12 is greater than the roughness of the other portion of the lateral surface 123 of the interconnection structure 12 covered by the package body 13. In some embodiments, the roughness of the 13r1 is greater than the roughness of the surface 131 of the package body 13.

As shown in FIG. 1, the electrical contacting area of the interconnection structure 12 merely includes the surface 121, thus the electrical contacts 14c of the electronic component 14 should be aligned with the conductive element 14s and the conductive element 14s should be aligned with the surface 121 of the interconnection structure 12 when forming the conductive element 14s and placing the electronic component 14; otherwise, disconnection therebetween may occur due to the displacement between the electronic component 14 and the conductive element 14s. This would increase difficulty and time for placing the electronic component 14 on the conductive element 14s.

In accordance with the embodiments as shown in FIGS. 3A-3D, the recess 13r is configured to accommodate at least a portion of the electrical contacts 14c of the electronic component 14. As shown in FIG. 3C, the electrical contact 14c is disposed within the recess 13r, and the electrical contact 14c is be surrounded or covered by the conductive element 14s. Therefore, during the manufacturing processes, if the electrical contact 14c is placed within the recess 13r, it is ensured that the electronic component 14 can be electrically connected to the interconnection structure 12 through the interconnection structure 12. For example, as shown in FIG. 3C, the central line 2C1 of the recess 13r is not necessary to be aligned with the central line 2C2 of the interconnection structure 12. For example, the central line of electrical contact 14c of the electronic component is not necessary to be aligned with the central line 2C2 of the interconnection structure 12. This can reduce the difficulty and time for forming the recess 13r and placing the electronic component 14 on the conductive element 14s.

In addition, since recess 13r is filled with the conductive element 14s, the requirement for designing the positions of the recess 13r and the interconnection structure 12 is relative loose. For example, it is unnecessary to align the central line of the recess 13r with the central line of the interconnection structure 12 as long as the interconnection structure 12 is exposed from the recess 13r. Therefore, it is more flexible to design the positions of the recess 13r and the interconnection structure 12. For example, as shown in FIG. 3C and FIG. 3D, the interconnection structure 12 may be disposed closer to the edge 13re (or the sidewall) of the recess 13r than the edge 13rc (or the sidewall) of the recess 13r. In other words, a distance between the interconnection structure 12 and the edge 13re of the recess 13r is less than a distance between the interconnection structure 12 and the edge 13rc of the recess 13r. In some embodiments, the edge 13re is adjacent to a lateral surface 13a of the package body 13. In some embodiments, the edge 13re is away from the central of the semiconductor device package. In some embodiments, the edge 13rc is away from the lateral surface 13a of the package body 13. In some embodiments, the edge 13rc is closer to the central of the semiconductor device package. Similarly, the interconnection structure 12 may be disposed closer to the edge 13ra (or the sidewall) of the recess 13r than the edge 13rb (or the sidewall) of the recess 13r. In other words, a distance between the interconnection structure 12 and the edge 13ra of the recess 13r is less than a distance between the interconnection structure 12 and the edge 13rb of the recess 13r. In some embodiments, the edge 13ra is adjacent to a lateral surface 13b of the package body 13. In some embodiments, the edge 13ra is away from the central of the semiconductor device package. In some embodiments, the edge 13rb is away from the lateral surface 13b of the package body 13. In some embodiments, the edge 13rb is closer to the central of the semiconductor device package. Therefore, the space S3 of the central portion of the semiconductor device package defined by the interconnection structures 12 increases, which can accommodate more components. For example, some of the electronic components may be disposed under the recess 13r. For example, a portion of the electronic components overlaps the recess 13r in a direction perpendicular to the substrate 10.

Furthermore, in some embodiments, due to the offset of the manufacturing process, the interconnection structure 12 may tilt with respect to the substrate 10. For example, as shown in FIG. 3E (which illustrates the interconnection structure 12 having a tilt structure), the interconnection structure 12 is not perpendicular to the substrate 10, resulting in that the surface 121 of the interconnection structure 12 is not parallel to the top surface 131 of the package body 13 before thinning operation. In accordance with the embodiments as shown in FIG. 1, a thinning operation should be performed till the dotted line E3 to ensure that the exposed top surface of the interconnection structure 12 would be coplanar with the top surface of the package body 13, which is a waste of the interconnection structure 12.

In accordance with the embodiments as shown in FIGS. 3A-3D, since the recess 13r is filled with the conductive element 14s to provide electrical connection between the electronic component 14 and the interconnection structure 12, it is not necessary to make the surface 121 of the interconnection structure 12 parallel to the surface 131 of the package body 13 even if the interconnection structure 12 tilts as shown in FIG. 3F. For example, the surface 121 of the interconnection structure 12 is not parallel to the surface 131 of the package body 13. For example, the lateral surface of the interconnection structure 12 exposed from the package body 13 has various lengths (or heights). This can reduce the manufacturing cost and time of the semiconductor device package 3.

Figure 3G:
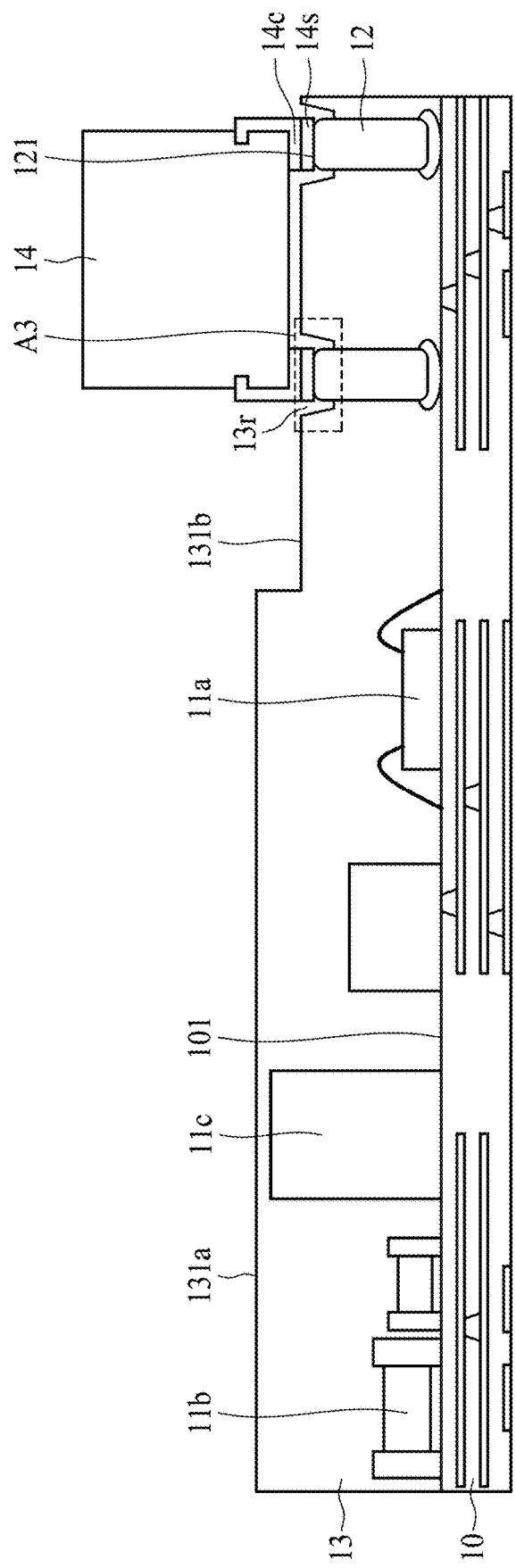
FIG. 3G is a cross-sectional view of a semiconductor device package, in accordance with an embodiment of the present disclosure.

In addition, since it is unnecessary to planarize the package body 13 to have a unified thickness, the package body 13 may have different thicknesses as shown in FIG. 3G, which illustrates a cross-sectional view of a semiconductor device package 3G, in accordance with some embodiments of the present disclosure. The semiconductor device package 3G is similar to the semiconductor device package 3 as shown in FIG. 3A, and some of the differences therebetween are described below.

The package body 13 has two top surfaces (e.g., the surface 131a and the surface 131b). The surface 131a and the surface 131b have different elevations with respect to the substrate 10. The surface 131a is higher than the surface 131b with respect to the substrate 10. The surface 131a and the surface 131b define a step structure. In some embodiments, the electronic component 11c disposed under the surface 131a has a thickness greater than the height of the interconnection structure 12. It is more flexible to design the arrangement of the electronic components of the semiconductor device package 3G. In some embodiments, the package body 13 with different thicknesses can be formed by selective molding or any other suitable techniques.

Figure 4A:
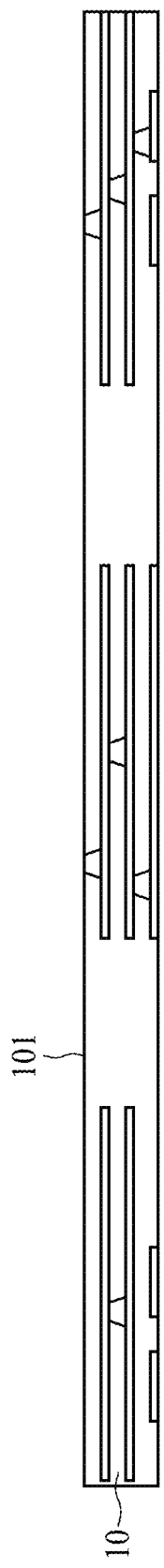
FIG. 4A, FIG. 4B, FIG. 4C, FIG. 4D, FIG. 4D', FIG. 4E, and FIG. 4E' illustrate a semiconductor manufacturing method in accordance with some embodiments of the present disclosure.
Figure 4B:
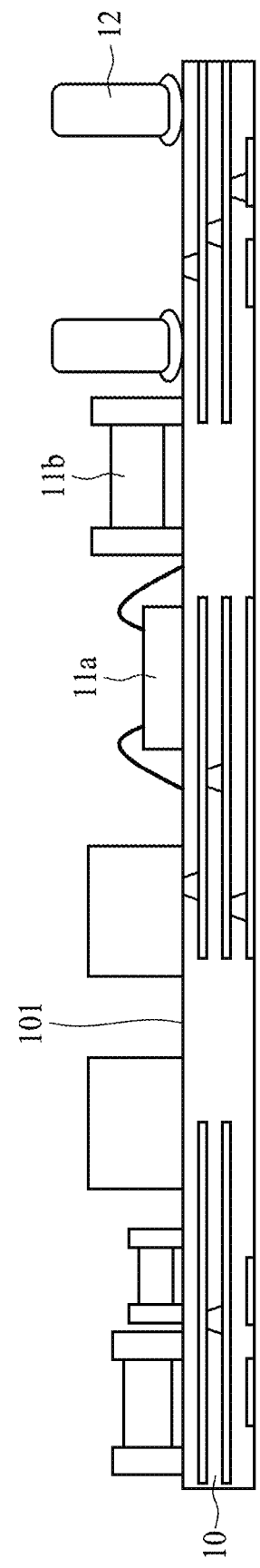
Figure 4D:
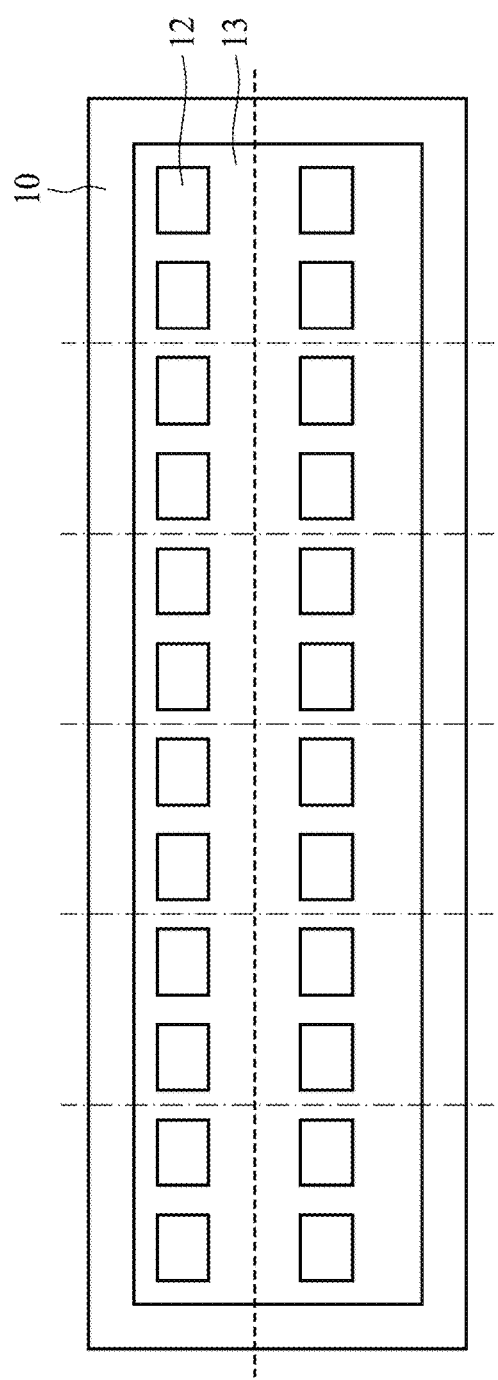
Figure 4E:
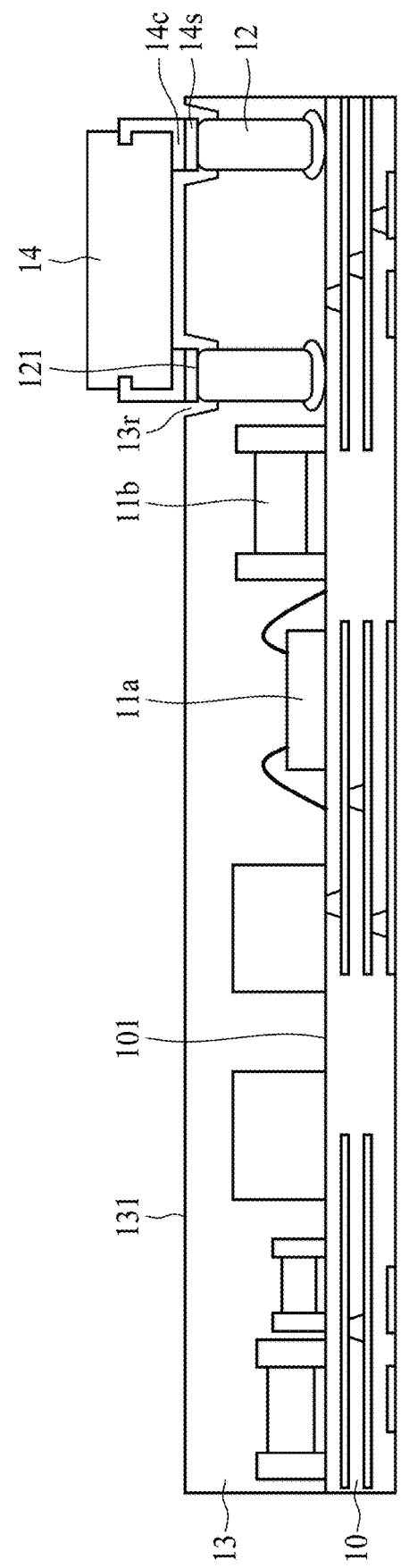
Figure 4E:
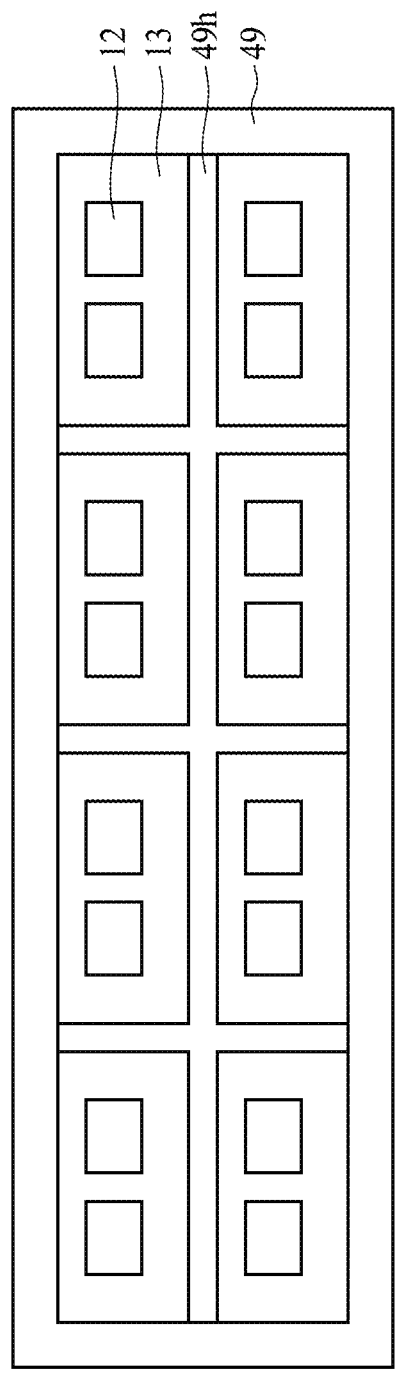

FIG. 4A, FIG. 4B, FIG. 4C, FIG. 4D, FIG. 4D', FIG. 4E, and FIG. 4E' illustrate a semiconductor manufacturing method in accordance with some embodiments of the present disclosure. In some embodiments, the method in FIG. 4A, FIG. 4B, FIG. 4C, FIG. 4D, FIG. 4D', FIG. 4E, and FIG. 4E' can be used to manufacture the semiconductor device package 3 in FIG. 3A.

Referring to FIG. 4A, a substrate strip including the substrate 10 is provided. Electronic components 11a, 11b and an interconnection structure 12 are then disposed on the surface 101 of the substrate 10 as shown in FIG. 4B. In some embodiments, the electronic component 11b and the interconnection structure 12 are disposed on the surface 101 of the substrate 10 by, for example, surface mount technique (SMT) or any other suitable techniques. In some embodiments, the electronic component 11a is electrically connected to the substrate 11 through, for example, wire bonding or any other suitable techniques. In some embodiments, the electronic component 11a may be disposed on the surface 101 of the substrate 10 after the electronic component 11b and the interconnection structure 12 have been disposed on the surface 101 of the substrate 10. Alternatively, the electronic components 11a, 11b and the interconnection structure 12 can be disposed on the surface 101 of the substrate 10 simultaneously.

Referring to FIG. 4C, a package body 13 is formed on the surface 101 of the substrate 10. The package body 13 fully covers or encapsulates the electronic components 11a, 11b and the interconnection structure 12. For example, a top surface (e.g., the surface 121) of the interconnection structure 12 is covered by the package body 13. In some embodiments, the package body 13 may be formed by compression molding technique, transfer molding technique, or any other suitable techniques.

Referring to FIG. 4D, a recess 13r is formed from a surface 131 of the package body 13 into the package body 13. The recess 13r exposes a portion of the interconnection structure 13r. For example, the surface 121 and a portion of the lateral surface of the interconnection structure 13r are exposed from the recess 13r. In some embodiments, the recess 13r may be formed by, etching, laser drilling, mechanical drilling, laser polishing, or any other suitable operations. In other embodiments, prior to the operation as shown in FIG. 4D, a portion of the package body 13 may be removed by a thinning operation (e.g., grinding) to expose the surface 121 of the interconnection structure, and the recess 13r is then formed.

Referring to FIG. 4E, an electronic component 14 is disposed on the interconnection structure 12 to form the semiconductor device package 3 as shown in FIG. 3A. For example, the electrical contacts 14c of the electronic component 14 are disposed within the recess 13r and electrically connected to the interconnection structure 12 through the conductive element 14c (e.g., soldering material). In some embodiments, the electronic component 14 is disposed on the interconnection structure 12 by, for example, SMT or any other suitable techniques.

In some embodiments, as shown in FIG. 4D' (which illustrates a top view of a strip of structures including the structure as shown in FIG. 4D), two adjacent units are too close to each other, and thus it is difficult to dispose the electronic component 14 on the interconnection structure 12. Therefore, singulation can be performed to the strip of the structures including the structure as shown in FIG. 4D to separate out individual structures. That is, the singulation is performed through the package body 13 and the substrate strip including the substrates 10. The singulation may be performed, for example, by using a dicing saw, laser or other appropriate cutting technique.

After singulation, each of individual structures can be disposed on a carrier 49 with an appropriate distance as shown in FIG. 4E' through an adhesive layer 49h (e.g., a tape or an adhesive film). In some embodiments, the new assembly process as shown in FIG. 4E' may be referred to as Recon process. Then, the electronic component 14 is disposed on the interconnection structure 12 as shown in FIG. 4E.

In other embodiments, if the distance between two adjacent units is sufficient for placing the electronic component 14, the singulation as shown in FIG. 4D' and the Recon process as shown in FIG. 4E' can be omitted. In this case, singulation can be performed to the strip of the structures including the structure as shown in FIG. 4E to separate out individual structures after the operations as shown in FIG. 4E.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

For example, substantially parallel can refer to a range of angular variation relative to 0° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, substantially perpendicular can refer to a range of angular variation relative to 90° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
    a substrate;
    an interconnection structure disposed over the substrate;
    a package body disposed over the substrate and partially covering the interconnection structure, wherein the package body has a recess, and the interconnection structure is at least partially within the recess;
    an electronic component comprising an electrical contact at least partially within the recess; and
    a conductive element connecting the electrical contact and the interconnection structure wherein the conductive element contacts a lateral surface of the electrical contact, the electrical contact comprises a vertical portion and a horizontal portion, and an elevation of a bottom end of the vertical portion is higher than an elevation of a top surface of the horizontal portion with respect to the substrate.

2. A semiconductor device package, comprising:
    a substrate;
    a interconnection structure disposed over the substrate;
    a package body disposed over the substrate and partially covering the interconnection structure, wherein the package body has a recess around the interconnection structure;
    an electronic component disposed over the interconnection structure; and a conductive element at least partially within the recess and electrically connecting the electronic component and the interconnection structure, wherein a melting point of the interconnection structure is higher than a melting point of the conductive element wherein the electronic component comprises an electrical contact at least partially extending over and from a lateral surface toward a bottom surface of the electronic component and connected to the conductive element.

3. A semiconductor device package, comprising:
a substrate;
a first interconnection structure disposed over the substrate; and
a package body disposed over the substrate and having a first recess exposing the first interconnection structure;
wherein in a top view perspective, the first interconnection structure has a geometric center,
the first recess has a first side, a second side opposite to the first side, a third side, and a fourth side opposite to the third side,
wherein a distance between the geometric center and the first side in a first direction is different from a distance between the geometric center and the second side in the first direction, and
wherein a distance between the geometric center and the third side in a second direction is different from a distance between the geometric center and the fourth side in the second direction, the second direction being substantially perpendicular to the first direction.

4. The semiconductor device package of claim 3, further comprising an electronic component disposed under the first recess.

5. The semiconductor device package of claim 3, further comprising a second interconnection structure disposed over the substrate, wherein the package body further has a second recess exposing the second interconnection structure, and in the top view perspective, a distance between a geometric center of the first recess and a geometric center of the second recess is less than a distance between the geometric center of the first interconnection structure and a geometric center of the second interconnection structure.

6. The semiconductor device package of claim 5, wherein the package body further has a third recess adjacent to the first recess, and in the top view perspective, the distance between the geometric center of the first recess and the geometric center of the second recess is different from a distance between the geometric center of the first recess and a geometric center of the third recess.

7. The semiconductor device package of claim 5, further comprising an electronic component free from overlapping the first recess and the second recess, wherein the electronic component is disposed between the first recess and the second recess from the top view perspective.

8. The semiconductor device package of claim 3, further comprising an electronic component disposed below the first recess, wherein the first recess comprises a first portion overlapping the electronic component and a second portion without overlapping the electronic component.

9. The semiconductor device package of claim 8, wherein an area of the first portion of the first recess is less than an area of the second portion of the first recess from the top view perspective.

10. The semiconductor device package of claim 1, wherein the vertical portion of the electrical contact has a first lateral surface and a second lateral surface opposite to the first lateral surface, the first lateral surface is closer to the electronic component than to the second lateral surface, the conductive element comprises a first portion contacting the first lateral surface of the vertical portion and a second portion contacting the second lateral surface of the vertical portion, and an area of the first portion of the conductive element is greater than an area of the second portion of the conductive element in a cross-sectional view perspective.

11. The semiconductor device package of claim 1, wherein the conductive element contacts an upper surface of the electrical contact in a cross-sectional view perspective.

12. The semiconductor device package of claim 1, wherein in a cross-sectional view perspective, a bottom surface of the recess comprises a first portion and a second portion spaced apart from the first portion by the interconnection structure, and a roughness of the first portion of the bottom surface is different from a roughness of the second portion of the bottom surface.

13. The semiconductor device package of claim 12, wherein in the cross-sectional view perspective, a width of the second portion of the bottom surface of the recess is greater than a width of the first portion of the bottom surface of the recess, the first portion does not vertically overlap the electronic component, and the second portion vertically overlaps the electronic component.

14. The semiconductor device package of claim 1, wherein the conductive element has a curved surface between the interconnection structure and a lateral sidewall of the recess and under the horizontal portion of the electrical contact.

15. The semiconductor device package of claim 1, wherein in a cross-sectional view perspective, the conductive element does not contact any lateral edge of the recess, the conductive element is spaced apart from a first lateral edge of the recess by a first distance, and the conductive element is spaced apart from a second lateral edge of the recess by a second distance different from the first distance.

16. The semiconductor device package of claim 2, wherein the conductive element contacts the lateral surface of the electronic component.

17. The semiconductor device package of claim 2, wherein the electrical contact comprises a portion extending over the lateral surface of the electronic component and partially embedded in the electronic component.

18. The semiconductor device package of claim 2, wherein the electrical contact has a first curved surface adjacent to and horizontally overlapping a corner portion of the electronic component.

19. The semiconductor device package of claim 18, wherein the electrical contact further has a second curved surface opposite to the first curved surface, the first curved surface is outside of the recess, the second curved surface is partially within the recess, and a length of the second curved surface is greater than a length of the first curved surface in a cross-sectional view perspective.

20. The semiconductor device package of claim 2, wherein the lateral surface of the electronic component vertically overlaps the interconnection structure.

* * * * *